United States Patent [19]

Cochran et al.

[11] Patent Number: 5,262,690
[45] Date of Patent: Nov. 16, 1993

[54] VARIABLE DELAY CLOCK CIRCUIT

[75] Inventors: David B. Cochran, Westlake, Ohio; Michael C. Lee, Elmhurst; Kathleen M. Owczarski, Wappingers Falls, both of N.Y.

[73] Assignee: International Business Machines Corporation, Armonk, N.Y.

[21] Appl. No.: 875,495

[22] Filed: Apr. 29, 1992

[51] Int. Cl.[5] .................. H03K 5/13; H03K 5/159; H03K 17/28
[52] U.S. Cl. .................. 307/601; 307/603; 307/608; 307/320
[58] Field of Search ............. 307/608, 603, 320, 601, 307/494, 592

[56] References Cited

U.S. PATENT DOCUMENTS

| | | | |
|---|---|---|---|
| 4,641,048 | 2/1987 | Pollock | 307/591 |
| 4,651,038 | 3/1987 | Cline et al. | 307/591 |
| 4,710,654 | 12/1987 | Saitoh et al. | 307/601 |
| 4,795,923 | 1/1989 | Dobos | 307/605 |
| 4,797,586 | 1/1989 | Traa | 307/603 |
| 4,801,827 | 1/1989 | Metz | 307/602 |
| 4,820,944 | 4/1989 | Herlein et al. | 307/603 |
| 4,862,020 | 8/1989 | Cowan et al. | 307/601 |
| 4,866,314 | 12/1989 | Traa | 307/603 |
| 4,874,966 | 10/1989 | Gehrt et al. | 307/291 |
| 4,878,028 | 10/1989 | Wang et al. | 328/55 |
| 4,893,036 | 1/1990 | Hester et al. | 307/603 |
| 5,012,142 | 4/1991 | Sonntag | 307/602 |
| 5,066,877 | 11/1991 | Hamano et al. | 307/608 |
| 5,175,454 | 12/1992 | Murakami | 307/603 |

OTHER PUBLICATIONS

IBM Technical Disclosure Bulletin, vol. 29, No. 7, Dec. 1986, "Clock Chopper For Complementary-Transistor Switch Arrays", pp. 3148-3151., Chan.

IBM Technical Disclosure Bulletin, vol. 32, No. 5B, Oct. 1989, "Time Delay Circuit for Harper PNP Array Clock Chopper", pp. 183-186., Canada et al.

*Primary Examiner*—Timothy P. Callahan
*Attorney, Agent, or Firm*—Whitham & Marhoefer

[57] ABSTRACT

A high-speed clock delay circuit in which an external differential digital clock signal is connected to a pair of differentially connected, current switching transistors. Emitter follower drivers couple the switching transistors to differential delayed clock output terminals. A pair of diodes cross-coupled between the differential output terminals and the switching transistors provide a relatively large Miller Effect capacitance, the charging and discharging of which provides a delay in the switching of the transistor pair, as measured differentially. Changing the charging and discharging current through the emitter follower driver, changes the bias across the diodes and thus changes their effective capacitance.

5 Claims, 2 Drawing Sheets

VARIABLE DELAY CLOCK CIRCUIT

BACKGROUND OF THE INVENTION

1. Field of the Invention

The invention relates to an improved, digital clock delay circuit especially adapted for implementation as a component of an integrated circuit, and more particularly to a compact delay circuit that provides a precisely controlled, delayed version of an input clock signal over a wide range of selectable delays.

Proper operation of certain high-speed, digital integrated circuits, such as, for example, programmable logic arrays, require high frequency clock signals that are slightly delayed with respect to an external clock signal. These delayed clock signals can be used to time various circuit operations and to compensate for the differences in the time required for signal propagation to different parts of the integrated circuit.

2. Description of the Prior Art

There have been a number of proposals in the prior art relating to digital clock delay circuits, also referred to in the art as clock choppers. These proposals include circuits in which a circuit produces a delayed version of a differential input clock with the delay caused by the time it takes to charge and discharge internal circuit capacitances using the internal circuit current. Changing the internal circuit current changes the delay. The following U.S. patents are examples of this type of digital clock delay circuit.

U.S. Pat. No. 4,874,966 to Gehrt et al., "Multivibrator Circuit Having Compensated Delay Time".

U.S. Pat. No. 4,866,314 to Traa, "Programmable High-Speed Digital Delay Circuit".

U.S. Pat. No. 4,862,020 to Cowan et al., "Electronic Delay Control Circuit Having Pulse Width Maintenance".

U S. Pat. No. 4,797,586 to Trass, "Controllable Delay Circuit".

U.S. Pat. No. 4,795,923 to Dobos, "Adjustable Delay Circuit".

U.S. Pat. No. 4,801,827 to Metz, "Adjustable Delay Element For Digital Systems".

U.S. Pat. No. 4,893,036 to Hester et al., "Differential Signal Delay Circuit".

In certain of these prior art circuits, the capacitance of the differential switching transistors is charged and discharged by a controllable current in order to generate a delay. However, the range of selectable delays produced by the charging and discharging of these capacitances is limited unless the circuit capacitance is large, since the acceptable range of current change is limited to a small range around the circuit operating point. It will be appreciated that high speed applications use circuit technology (i.e., bi-polar integrated circuits) that have transistors with small internal capacitances. Thus, in order to obtain sufficient internal capacitance for a large delay range in one circuit, large transistors would be required. But such an approach, like using two stages of delay, requires space on the integrated circuit and is therefore a disadvantageous approach.

SUMMARY OF THE INVENTION

An object of this invention is the provision of a space efficient, single stage, high-speed clock delay circuit that has a large range of selectable delays; a circuit that fits in the space of a simple bi-polar high-speed logic gate.

Another object is a delay circuit whose operation is relatively immune to temperature, process and power supply variations.

A further object is the provision of a variable clock delay circuit that maintains a close tolerance on the width of the delayed output clock pulse.

Briefly, this invention contemplates the provision of a high-speed clock delay circuit in which an external differential digital clock signal is connected to a pair of differentially connected, current switching transistors. Emitter follower drivers couple the switching transistors to differential delayed clock output terminals. A pair of diodes cross-coupled between the differential output terminals and the switching transistors provide a relatively large Miller Effect capacitance, the charging and discharging of which provides a delay in the switching of the transistor pair, as measured differentially. Changing the charging and discharging current through the emitter follower driver, changes the bias across the diodes and thus changes their effective capacitance. A change in the effective capacitance of the diodes changes the switching speed of the switching transistors and thus varies the delay introduced by the circuit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
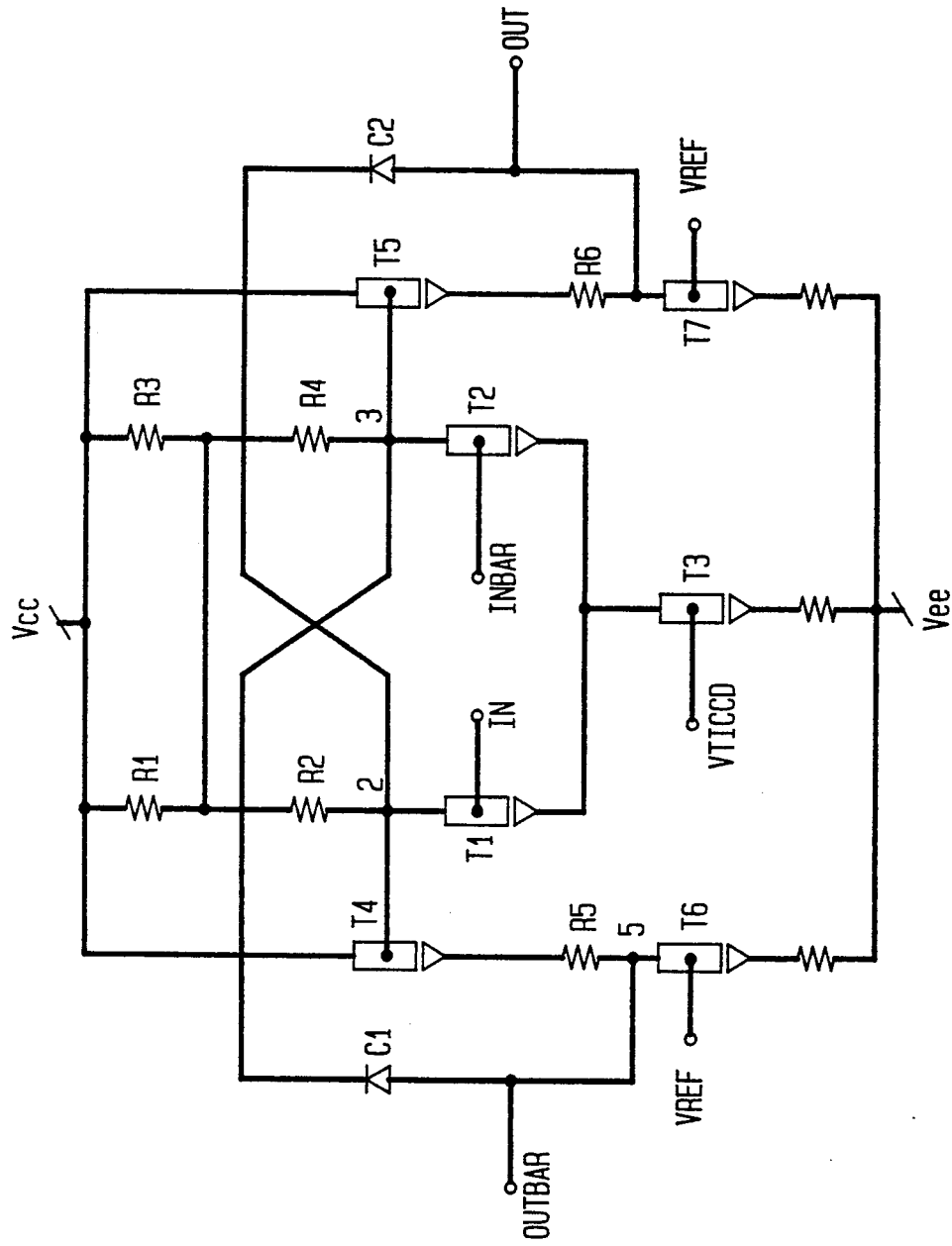
FIG. 1 is a schematic diagram of a preferred embodiment of a digital clock delay circuit in accordance with the teachings of this invention.

Referring now to FIG. 1, a pair of bi-polar, NPN transistors T1 and T2 are connected as conventional emitter coupled current switch, with a transistor T3 maintaining a constant current through the switch. An external, differential clock signal, which is to be delayed, is coupled to base terminals IN and INBAR of transistors T1 and T2 respectively; for example, a primary phase coupled to IN and a complementary phase coupled to INBAR. As the primary phase clock input to IN falls, it switches off transistor T1; the simultaneously rising input to T2 turns T2 on, and vice versa. Resistors R1, R2, R3, and R4 provide operating bias to transistors T1 and T2.

Collector nodes 2 and 3 of transistors T1 and T2 are coupled respectively to emitter follower output drivers T4 and T5. Transistors T6 and T7 provide a constant current source for the circuit legs that include drivers T4 and T5. As will be explained in more detail, the magnitude of the constant current in each leg is varied by varying VREF input to T6 and T7 in order to vary the magnitude of the delay introduced by the circuit. It will be appreciated that the potential at node 5 follows node 2, due to the constant current through resistor R5 and, similarly, the potential of node 6 follows node 3 due to the constant current through R6.

In phase output terminal OUTBAR is connected to node 5 and follows the potential at node 2 of switching transistor T1. Similarly, a complementary phase output terminal OUT is connected to node 6 and follows the potential at node 3 of transistor T2. The circuit delay between the differential clock input to IN and INBAR and the differential output at OUT and OUTBAR is a function of the switching delay of transistors T1 and T2.

PN junction diodes C1 and C2 are used to introduce an appreciable switching delay. It should be noted that the circuit operating parameters between a positive supply terminal VCC and a negative supply terminal VEE are such that the diodes C1 and C2 are continuously back biased in operation of the circuit.

Diode C1 is cross connected between output terminal OUTBAR and node 3 of transistor T2. Similarly, diode C2 is cross connected between output terminal OUT and node 2 of transistor T1. As will be appreciated by those skilled in the art, since there is a negative gain between OUTBAR and node 3 and a negative gain between OUT and node 2, the effective capacitance of C1 and C2 is equal to the measured capacitance of C1 and C2 multiplied by gain between the OUTBAR and node 3 in the case of C1 and between OUT and node 2 in the case of C2. This increase in effective capacitance is due to the so-called Miller Effect.

Consequently, the junction capacitance of a PN diode, when connected in accordance with the teachings of this invention, produces a delay. It will be appreciated that this delay is a function of the rate at which C1 and C2 charge and discharge as nodes 2 and 3 swing up and down in response to the differential clock input signal. This charging and discharging rate is in turn a function of the magnitude of the effective capacitance of C1 and C2. Transistors T6 and T7 provide a constant bias current to diodes C1 and C2. Varying the reference potential VREF at the base of T6 and T7 varies this bias current and hence the effective capacitance of C1 and C2. A change in the effective capacitance of C1 and C2 changes the circuit delay; for example, the current may be adjusted by means of an on-chip circuit variable delay control circuit such as, for example, that shown in FIG. 2, with a corresponding delay change.

Figure 2:
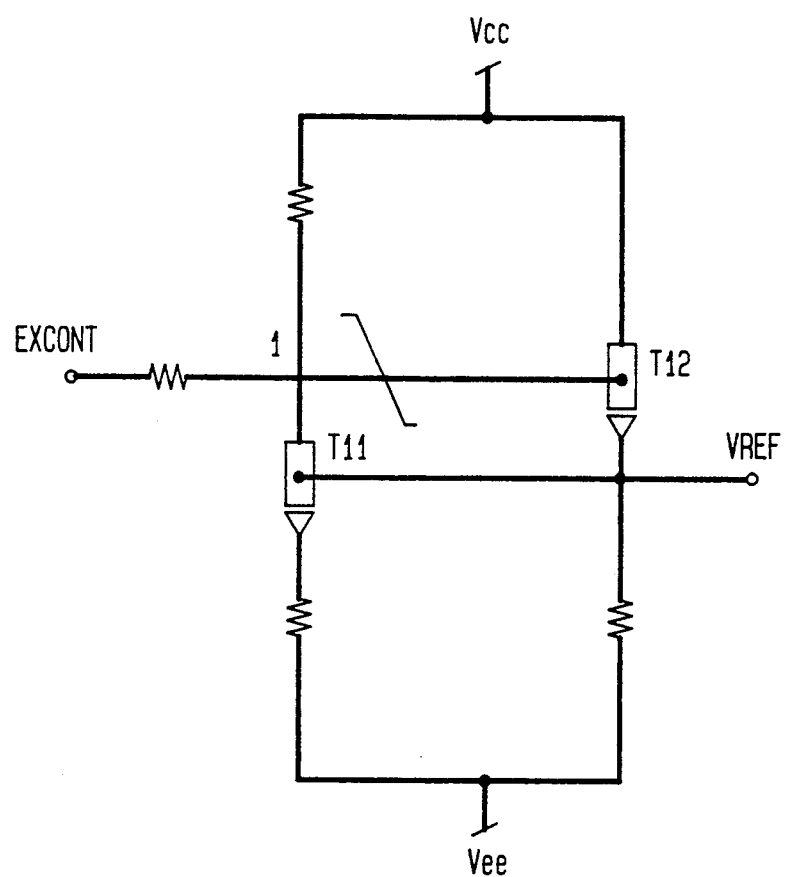
FIG. 2 is a schematic diagram of a control circuit for use in conjunction with the circuit of FIG. 1 in order to vary the circuit current and thus vary the clock delay.

In the circuit of FIG. 2, the output voltage VREF varies in response to changes in an external input EX-CONT. As will be appreciated by those skilled in the art, NPN transistor T11 functions as a current mirror with transistor T12 providing an emitter follower fan out. The same basic on-chip circuit of FIG. 2 can also be used to provide the fixed reference VT1CCD to transistor T3.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A delay circuit for a differential signal with a primary phase and a complementary phase, comprising in combination;

a pair of transistors coupled as a differential current switch including a primary phase input terminal coupled to one of said transistor pair and a complementary phase input terminal coupled to the other of said transistor pair;

means coupling an output node of one of said pair of transistors to a primary phase output terminal so that an output at said primary phase output terminal is in phase with an input at said primary phase input terminal;

means coupling an output node of the other one of said pair of transistors to a complementary phase output terminal so that an output at said complementary phase output terminal is in phase with an input at said complementary phase input terminal;

first capacitance means coupling said primary phase output terminal and said output node of said other one of said pair of transistors; and second capacitance means coupling said complementary output terminal and said output node of said one of said pair of transistors.

2. A delay circuit for a differential signal with a primary phase and a complementary phase, comprising in combination;

a pair of transistors coupled as a differential current switch including a primary phase input terminal coupled to one of said transistor pair and a complementary phase input terminal coupled to the other of said transistor pair;

means coupling an output node of one of said pair of transistors to a primary phase output terminal so that an output at said primary phase output terminal is in phase with an input at said primary phase input terminal;

means coupling an output node of the other one of said pair of transistors to a complementary phase output terminal so that an output at said complementary phase output terminal is in phase with an input at said complementary phase input terminal;

a first diode means coupling said primary phase output terminal and said output node of said other one of said pair of transistors;

a second diode means coupling said complementary output terminal and said output node of said one of said pair of transistors; and means for establishing a bias current through said first diode means and through said second diode means.

3. A delay circuit for a differential signal as in claim 2, wherein said first diode means and said second diode means are each a PN junction diode.

4. A delay circuit for a differential signal as in claim 3, further including means for back biasing said first PN junction diode and said second PN junction diode.

5. A delay circuit for a differential signal as in claim 4, wherein said means for establishing a bias current includes means for establishing a variable constant bias current whereby varying the bias current through said first PN junction diode and said second PN junction diode varies the effective capacitance of said first PN junction diode and said second PN junction diode.

* * * * *